United States Patent
Akke et al.

(10) Patent No.: US 8,159,229 B2
(45) Date of Patent: Apr. 17, 2012

(54) LOAD COMPENSATION IN DISTANCE PROTECTION OF A THREE-PHASE POWER TRANSMISSION LINE

(75) Inventors: Magnus Akke, Simlinge (SE); Björn Westman, Västerås (SE); Henrik Åshuvud, Västerås (SE)

(73) Assignee: ABB Technology Ltd., Zürich (CH)

( * ) Notice: Subject to any disclaimer, the term of this patent is extended or adjusted under 35 U.S.C. 154(b) by 151 days.

(21) Appl. No.: 12/293,601

(22) PCT Filed: Oct. 18, 2006

(86) PCT No.: PCT/EP2006/067552
§ 371 (c)(1),
(2), (4) Date: May 17, 2010

(87) PCT Pub. No.: WO2008/046451
PCT Pub. Date: Apr. 24, 2008

(65) Prior Publication Data
US 2010/0225329 A1 Sep. 9, 2010

(51) Int. Cl.
*G01R 31/08* (2006.01)
*H02H 3/00* (2006.01)
(52) U.S. Cl. ............ 324/525; 324/521; 361/80; 702/59
(58) Field of Classification Search ............ 324/521, 324/525; 361/80; 702/59
See application file for complete search history.

(56) References Cited

U.S. PATENT DOCUMENTS

| | | | | |
|---|---|---|---|---|
| 4,686,601 A | * | 8/1987 | Alexander et al. | 361/80 |
| 4,841,405 A | * | 6/1989 | Udren | 361/80 |
| 5,446,387 A | | 8/1995 | Eriksson et al. | |
| 5,773,980 A | * | 6/1998 | Yang | 324/525 |
| 5,796,258 A | * | 8/1998 | Yang | 324/521 |
| 5,956,220 A | * | 9/1999 | Novosel et al. | 361/80 |
| 2003/0011951 A1 | | 1/2003 | Mooney | |

FOREIGN PATENT DOCUMENTS

| | | |
|---|---|---|
| EP | 0994548 A2 | 4/2000 |
| EP | 1289093 A2 | 3/2003 |
| JP | 08163772 A | 6/1996 |
| JP | 2004364376 A | 12/2004 |
| WO | WO-97/45919 A2 | 12/1997 |

OTHER PUBLICATIONS

PCT/ISA/210—International Search Report—Oct. 2, 2007.
PCT/ISA/237—Written Opinion of the International Searching Authority—Oct. 2, 2007.

* cited by examiner

*Primary Examiner* — Timothy J Dole
(74) *Attorney, Agent, or Firm* — Venable LLP; Eric J. Franklin

(57) ABSTRACT

A load compensation method for phase-to-ground loops in distance protection. A first reactive reach is estimated assuming zero fault resistance or with a positive sequence current. A second reactive reach is estimated with a zero sequence current. A third reactive reach is estimated with a negative sequence current. An import or export condition is estimated. A fourth reactive reach for import or export condition is estimated based on the first, second and third reactive reach. A fault impedance is estimated based on the estimated fourth reactive reach.

15 Claims, 2 Drawing Sheets

LOAD COMPENSATION IN DISTANCE PROTECTION OF A THREE-PHASE POWER TRANSMISSION LINE

CROSS-REFERENCE TO RELATED APPLICATIONS

This application is the national phase under 35 U.S.C. §371 of PCT/EP2006/067552 filed 18 Oct. 2006.

TECHNICAL FIELD

The present invention relates to a method and a device for determining a distance to fault in distance protection of a three-phase power transmission line.

BACKGROUND

Distance protection is one of various methods commonly used to recognize a fault in a power transmission network and to react on it by isolating the faulty transmission line from the rest of the power network. Distance protection is achieved by attaching distance protection relays to the ends of transmission lines and by measuring phase currents and phase voltages. From the measurements, an impedance is calculated which, in case of a fault, is representative of the distance between the measuring equipment and the fault. In the following, this distance is called distance to fault. In dependence of the value of the calculated impedance different distance zones are defined. A time limit is assigned to each distance zone specifying when the faulty line is to be tripped by the corresponding distance relays. The smaller the calculated impedance the closer is the fault to the measuring equipment and the shorter is the time limit before the line is tripped.

In EP 0 671 011 B1 a method is disclosed for determining the relative distance to fault from a measuring station located close to one of the ends of a transmission line. The measuring station provides measurements of phase currents and voltages of the transmission line. The method is based on an extended fault model which takes into account the zero sequence impedance of the line. Additionally, the method assumes that the fault current, i.e. the current through the fault resistance, is fed to the fault point from both ends of the transmission line.

DESCRIPTION OF THE INVENTION

An object of the present invention is to provide an improved method and device for determining the distance to fault where it is assumed that the fault current is fed from the two ends of the transmission line.

According to a first aspect of the invention there is provided a method.

According to a second aspect of the invention there is provided a device.

The invention is based on the fact that during distance protection and when fault currents are fed from the two ends of a transmission line, a special problem may occur. If the fault currents from the two line ends have different phase angles the voltage drop across the fault resistance can distort the phase currents and voltages in such a way that the calculated impedance indicates a wrong distance to fault resulting in an incorrect identification of the distance zone.

If the identified distance zone lies closer to the measuring equipment than the actual fault, then the tripping is carried out too early, or even unnecessarily in case the fault would have disappeared before reaching the time limit of the next zone. This situation is called an over-reach.

If the identified distance zone lies further away than the actual fault, then the tripping might be carried out too late, which is called an under-reach.

The effect of over- or under-reach is aggravated under heavy load conditions. If no action is taken to especially compensate for the over-reach an undesired instantaneous trip of the line may occur which can have disastrous consequences in the whole power network such as outages or even blackouts.

The invention is based on the general idea of using three different fault models for estimating three different impedance values and combining the different impedances to a resulting impedance, where the way the combination is performed is subject to the load condition on the transmission line.

The first of the three fault models is based on the assumption that the fault current corresponds to at least one of the phase currents of the transmission line. The second and the third fault model are based on the assumption that the fault current corresponds to a negative-sequence or a zero-sequence current component of the phase currents, respectively. Each of the three impedances as well as the resulting impedance represent an estimation of the distance to fault, where the resulting impedance represents the value which comes closest to the real distance to fault. The load condition is assigned to one of the following classifications: normal, over-reach or under-reach. In dependence of the assignment, the corresponding way of combining the three impedances is chosen.

The advantage of this method and of the device to perform this method is the fact that they compensate for the negative effect of a heavy load on the accuracy of distance protection. The compensation is achieved by distinguishing between normal load conditions and over-reach and under-reach and by taking the load classification into account when generating the value of the impedance which represents the distance to fault. Since the accuracy of the distance to fault is improved, the corresponding distance protection zone can be identified with higher reliability. Accordingly, an early or late and especially an unnecessary trip of the transmission line can be prevented, which reduces the risk of unnecessary outages and minimizes the resulting costs of inappropriate line tripping.

In a preferred embodiment of the invention the phase currents are received from one of the two ends of the transmission line and the load condition is determined as the direction of the power flow with respect to this one end. The load condition where the power flows from the end where the phase currents are measured to the remote end of the transmission line is called load export. The load condition where the power flows in the opposite direction, i.e. from the remote end to the end where the phase currents are measured, is called load import.

In the special case of a phase-to-ground fault on the line, the direction of the power flow is determined based on the phase currents and the phase-to-phase voltage of the two healthy phases of the line instead of using all three phases. Thereby it is ensured that only those measurements are used to determine the load condition which reliably represent the power flow.

In a further embodiment the load condition is determined based on a combination of the power flow and of the range of the actual load value. If the load value exceeds a predetermined value, a so called heavy load condition is indicated. In case of heavy load as well as load export, the load condition is classified as over-reach. In case of heavy load as well as load import, the load condition is classified as under-reach. In all other cases, the load condition is classified as normal.

In the following, various embodiments of the method for determining a distance to fault are described in detail.

Provided a phase-to-ground fault occurred on the first of the three phases, then the load import or export condition is preferably estimated by measuring the currents $I_{L2}$ and $I_{L3}$ in the second and the third of the three phases and the voltage $U_{L2L3}$ between the second and the third phase by using the following formula:

$$P_{flow} = Re(U_{L2L3}(I_{L2}-I_{L3})^*)$$

The resulting impedance is determined in various ways. In a preferred embodiment of the invention, only the imaginary part of the resulting impedance is determined and accordingly, only the imaginary parts of the first, second and third impedances are used. If an impedance Z can generally be expressed as the complex number $Z=\beta+j\alpha$, then only the imaginary part $\alpha$ is used.

In case of over-reach, the resulting impedance $\alpha_{over,a}$ can be determined as the average of the two largest of the first, second and third impedance, $\alpha_1$ to $\alpha_3$, according to:

$$\alpha_{over,a} = 0.5(\alpha_1+\alpha_2+\alpha_3-\min(\alpha_1,\alpha_2,\alpha_3)).$$

In the special case of over-reach combined with a very small fault current compared to the zero-sequence current component of the phase currents, another equation is applied. This special case may for example occur at a power station with disconnected generation, but with grounded transformers in operation. To recognize this case the fault current is determined and compared with the zero-sequence current component. If the zero-sequence current component exceeds a predetermined multiple of the fault current, the resulting impedance $\alpha_{over,b}$ is determined as the average of the third impedance $\alpha_3$ and of the largest of the first and the second impedance, $\alpha_1$ and $\alpha_2$: $\alpha_{over,b}=0.5(\alpha_3+\alpha_1+\alpha_2-\min(\alpha_1,\alpha_2))$. The predetermined multiple may preferably be chosen as a number larger than 5.

If under-reach is assigned to the load condition, then the resulting impedance $\alpha_{under,a}$ is determined as the median of the first, second and third impedances, $\alpha_1$ to $\alpha_3$:

$$\alpha_{under,a}=(\alpha_1+\alpha_2+\alpha_3-\min(\alpha_1,\alpha_2,\alpha_3)-\max(\alpha_1,\alpha_2,\alpha_3)).$$

Alternatively, the resulting impedance $\alpha_{under,b}$ can be determined as the mean value of the three impedances $\alpha_1$ to $\alpha_3$:

$$\alpha_{under,b} = \frac{(\alpha_1+\alpha_2+\alpha_3)}{3}.$$

Another alternative is the combination of the median $\alpha_{under,a}$ with the mean value $\alpha_{under,b}$ of the first, second and third impedances according to the following equation:

$$\alpha_{under,c} = \frac{(\alpha_{under,a}+\alpha_{under,b})}{2}.$$

In order to simplify the determination of the first impedance and hence the first model, it is assumed in a special embodiment that the fault resistance is of zero value, which results in the fault current being of zero value, too.

In the special case that the zero-sequence current component is very small, the third impedance $\alpha_3$ is set to the value of the first impedance $\alpha_1$. This case is detected by determining if the zero-sequence current component is below a predetermined threshold.

In the special case that the negative-sequence current component is very small, the second impedance $\alpha_2$ is set to the value of the first impedance $\alpha_1$. This case is detected by determining if the negative-sequence current component below a predetermined threshold.

An embodiment of the present invention will now be described with reference to FIGS. 1, 2 and 3.

Figure 1:
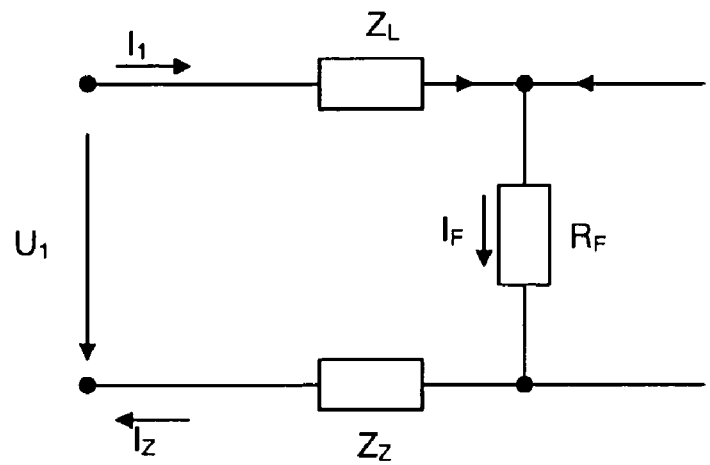
FIG. 1 schematically shows a model of a phase-to-ground fault in a power transmission line.

A phase-to-ground loop in a three-phase power transmission line affecting the first of the three phases can be modeled as shown in FIG. 1. The power transmission line belongs to a power network. The location of the voltage $U_1$ indicates one of the two ends of the transmission line, where at this location a measuring unit is installed to measure the phase currents $I_1$, $I_2$ and $I_3$ and the phase voltages $U_1$, $U_2$ and $U_3$ of the line. The resistance $R_F$ indicates the location of the fault on the line. The other end of the transmission line is not shown. It is situated in some distance to the right from the fault. It is assumed that the fault current $I_F$ is fed from both ends of the transmission line, as indicated by the arrows 1 and 2.

The voltage $U_1$ across the fault loop is calculated according to the following equation: $U_1=Z_LI_1+R_FI_F+Z_NI_N$, wherein $U_1$ is the phase-to-ground voltage at the one end of the line where the measurements are taken, $Z_L$ is an impedance of the faulty phase indicating the distance between the measuring location and the fault, $R_F$ is the fault resistance and $Z_Z$ is the zero-sequence impedance. The current $I_1$ is the phase current of the first phase at the measuring location, the current $I_Z$ is the zero-sequence current component of the phase currents at the measuring location and the current $I_F$ is the fault current which flows through the fault resistance $R_F$.

The phase current $I_1$ can be measured and the zero-sequence current component $I_Z$ can be derived by known methods from the measurements of all three phase currents. The fault current $I_F$ is not known.

According to a first fault model, the fault current $I_F$ is set to be equal to the phase current $I_1$. According to a second fault model, the fault current $I_F$ is set to be equal to the zero-sequence current component $I_Z$ of the phase currents, which can be determined according to known methods from the three phase currents. According to a third fault model, the fault current $I_F$ is set to be equal to the negative-sequence current component of the phase currents, where the negative-sequence current component can be determined by known methods from the three phase currents.

Figure 2:
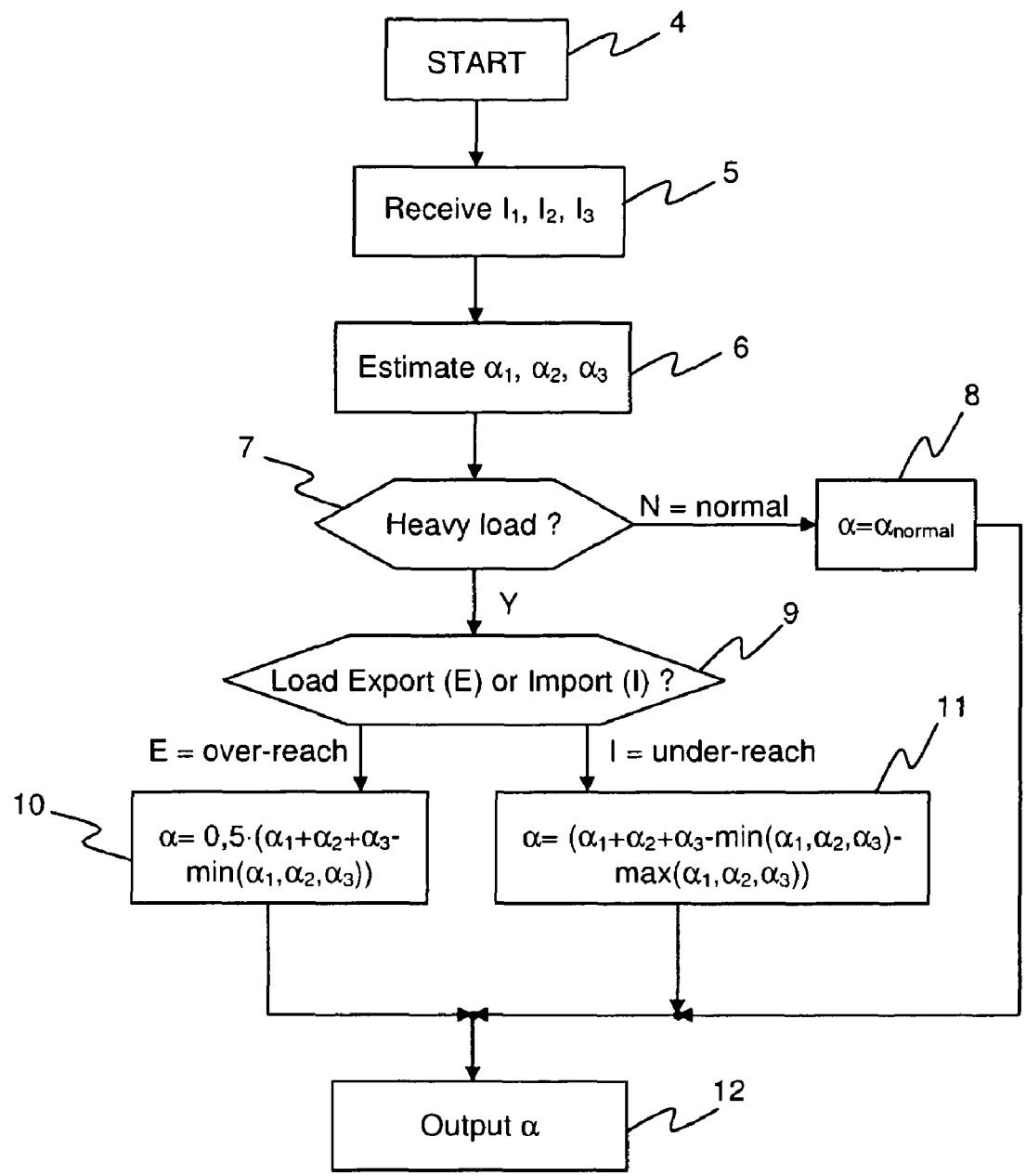

The flow chart of FIG. 2 shows the steps to determine the so called resulting impedance a which represents the distance to fault. After starting the determination process (step 4), the values of the three phase currents $I_1$, $I_2$ and $I_3$ are received in step 5. Based on the phase currents $I_1$ to $I_3$, a first impedance $\alpha_1$ is determined using the first fault model. Accordingly, a second impedance $\alpha_2$ and a third impedance $\alpha_3$ are determined, using the second and the third fault model, respectively (step 6). Apart from the phase currents, which form the main source of information for determining the distance to fault, other information may be used. This information can be values of the phase voltages $U_1$ to $U_3$ as well as different line parameters, such as the line impedance $X_L$ and the zero-sequence impedance $X_N$. In the next step 7 it is determined whether a heavy load condition exists on the line. If no heavy load condition exists (N), a normal load condition is recognized and in step 8 the resulting impedance α is set equal to the normal load impedance $α_{normal}$, which represents the distance to fault under normal load conditions. The normal load impedance $α_{normal}$ is calculated by known fault location methods.

If a heavy load condition is detected in step 7 (Y), the direction of the power flow is determined in step 9. If load export is identified, then the load condition is classified as over-reach and the resulting impedance α is calculated in step 10 as the average of the two largest of the first, second and third impedance $α_1$ to $α_3$. If load import is identified, then the load condition is classified as under-reach and the resulting impedance α is calculated in step 11 as the median of the first, second and third impedance $α_1$ to $α_3$.

The resulting impedance α is finally output to another process where the distance zone is determined based on the impedance value.

Figure 3:
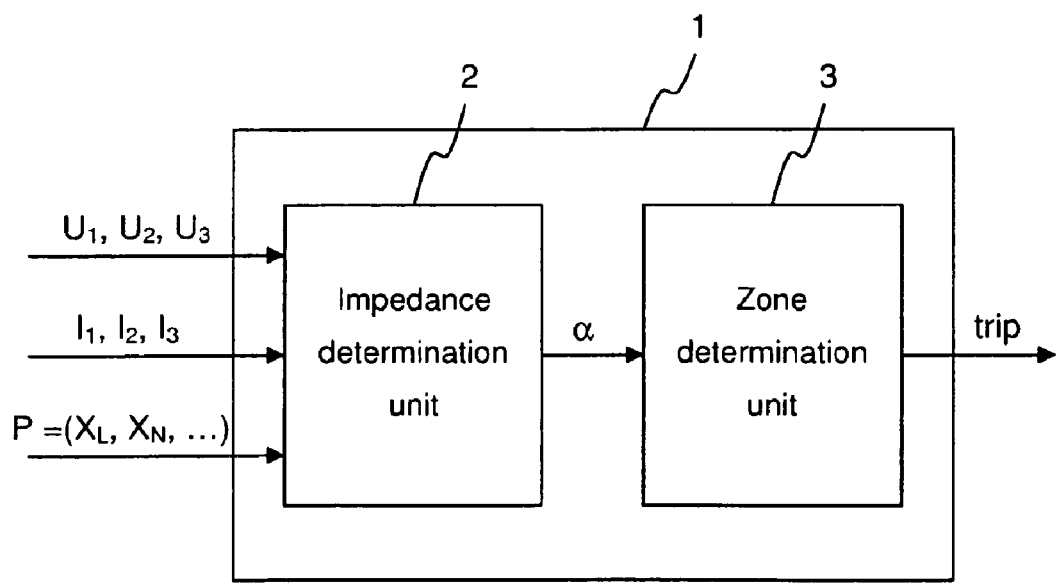
FIG. 2 shows a flow chart of a method for determining a distance to fault in distance protection of a three-phase power transmission line and FIG. 3 shows a schematic diagram of a device for carrying out the method of FIG. 1 and for generating a trip signal for distance protection.

The method described with respect to FIG. 2 is performed by an impedance determination unit 2 as depicted in FIG. 3. The impedance determination unit 2 represents a device for determining a distance to fault, since the resulting impedance α represents and correlates directly to the distance to fault. In order to determine the resulting impedance α, the phase currents $I_1$ to $I_3$ as well as the phase voltages $U_1$ to $U_3$ are received. Apart from that parameters P are received, either from an external unit or from an internal storage unit.

The impedance determination unit 2 is part of a device for distance protection 1 which comprises additionally a zone determination unit 3 to determine the distance zone and to generate a corresponding trip signal to disconnect the faulty transmission line from the rest of the power network.

The invention claimed is:

1. A method for determining a distance to fault in distance protection of a three-phase power transmission line, where in case of a fault on the line:
it is assumed that a fault current is fed from two ends of the transmission line,
measurements of phase currents are received,
a first impedance of the line representing a distance to fault is estimated using a first fault model,
the method comprising:
basing a first fault model on an assumption that the fault current corresponds to at least one of the phase currents,
estimating a second impedance of the line representing the distance to fault using a second fault model, wherein the second fault model is based on an assumption that the fault current corresponds to a negative-sequence component of the phase currents,
estimating a third impedance of the line representing the distance to fault using a third fault model, wherein the third fault model is based on an assumption that the fault current corresponds to a zero-sequence current component of the phase currents,
determining a load condition on the line,
assigning the load condition to one of classifications normal, over-reach or under-reach, and
determining a resulting impedance based on a combination of the first impedance, the second impedance and the third impedance depending on the assigned classification.

2. The method according to claim 1, wherein the phase currents are received from one end of the transmission line, and wherein the load condition is determined as a direction of the power flow with respect to the one end.

3. The method according to claim 2, wherein in case of a phase-to ground fault the direction of the power flow is determined based on the phase currents and a phase-to-phase voltage of two healthy phases of the line.

4. The method according to claim 2, further comprising:
assigning over-reach if the direction of the power flow indicates a load export and if the load exceeds a predetermined value.

5. The method according to claim 2, further comprising:
assigning under-reach if the direction of the power flow indicates a load import and if the load exceeds a predetermined value.

6. The method according to claim 1, wherein if over-reach is detected a resulting impedance is determined as an average of two largest of the first, second and third impedance.

7. The method according to claim 1, further comprising:
determining a fault current and
determining an impedance resulting from the fault current as the average of the third impedance and of the largest of the first and the second impedance if over-reach is detected and if the zero-sequence current component exceeds a predetermined multiple of the fault current.

8. The method according to claim 1, wherein if under-reach is detected the resulting impedance is determined as the median of the first, second and third impedance.

9. The method according to claim 1, wherein if under-reach is detected the resulting impedance is determined as the average of the mean and of the median of the first, second and third impedance.

10. The method according to claim 1, wherein the first, second, third and the resulting impedance are each represented by their imaginary part.

11. The method according to claim 1, wherein the first impedance is estimated assuming that the fault resistance is of zero value.

12. The method according to claim 1, wherein the third impedance is set to the value of the first impedance in case the zero-sequence current component is below a predetermined threshold.

13. The method according to claim 1, wherein the second impedance is set to the value of the first impedance in case the negative-sequence current component is below a predetermined threshold.

14. A computer program product, comprising:
a computer readable medium; and
computer program instructions recorded on the computer readable medium and executable by a processor for implementing a method for determining a distance to fault in distance protection of a three-phase power transmission line, where in case of a fault on the line:
it is assumed that a fault current is fed from two ends of the transmission line,
measurements of phase currents are received,
a first impedance of the line representing a distance to fault is estimated using a first fault model,
the method comprising:
basing a first fault model on an assumption that the fault current corresponds to at least one of the phase currents,
estimating a second impedance of the line representing the distance to fault using a second fault model, wherein the second fault model is based on an assumption that the fault current corresponds to a negative-sequence component of the phase currents,
estimating a third impedance of the line representing the distance to fault using a third fault model, wherein the third fault model is based on an assumption that the fault current corresponds to a zero-sequence current component of the phase currents, determining a load condition on the line, assigning the load condition to one of classifications normal, over-reach or under-reach, and determining a resulting impedance based on a combination of the first impedance, the second impedance and the third impedance depending on the assigned classification.

15. A device for determining a distance to fault in distance protection of a three-phase power transmission line, comprising:

an impedance determination unit, wherein the impedance determination unit receives measurements of the phase currents, and estimates a first impedance of the line representing the distance to fault based on a first fault model, wherein the first fault model is based on the assumption that the fault current corresponds to at least one of the phase currents, and wherein the impedance determination unit estimates a second impedance of the line representing the distance to fault using a second fault model, where the second fault model is based on the assumption that the fault current corresponds to a negative-sequence component of the phase currents, estimates a third impedance of the line representing the distance to fault using a third fault model, where the third fault model is based on the assumption that the fault current corresponds to a zero-sequence current component of the phase currents, determines a load condition on the line, assigns the load condition to one of classifications normal, over-reach or under-reach, and depending on the assigned classification determines a resulting impedance by a combination of the first, second and third impedance.

* * * * *